(12) United States Patent
Zonte et al.

(10) Patent No.: US 8,773,913 B1
(45) Date of Patent: Jul. 8, 2014

(54) SYSTEMS AND METHODS FOR SENSING IN MEMORY DEVICES

(75) Inventors: Cristinel Zonte, Colorado Springs, CO (US); Vijay Raghavan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 124 days.

(21) Appl. No.: 13/340,362

(22) Filed: Dec. 29, 2011

Related U.S. Application Data

(60) Provisional application No. 61/566,315, filed on Dec. 2, 2011.

(51) Int. Cl.
*G11C 16/06* (2006.01)

(52) U.S. Cl.
USPC ............... 365/185.21; 365/189.02; 365/210.1

(58) Field of Classification Search
USPC ............. 365/185.21, 185.17, 185.24, 189.02, 365/205, 210.1
See application file for complete search history.

(56) References Cited

U.S. PATENT DOCUMENTS

| | | | |
|---|---|---|---|
| 7,286,398 B2 | 10/2007 | Yano et al. | |
| 7,542,363 B2 * | 6/2009 | Kubo et al. | 365/207 |
| 7,545,693 B2 * | 6/2009 | Toda | 365/205 |
| 7,596,032 B2 | 9/2009 | Ogawa et al. | |
| 7,885,132 B2 * | 2/2011 | Kubo et al. | 365/211 |
| 7,995,397 B1 | 8/2011 | Raghavan | |
| 8,059,471 B2 | 11/2011 | Leung | |
| 8,199,595 B2 * | 6/2012 | Bauser et al. | 365/207 |
| 8,289,775 B2 * | 10/2012 | Lee et al. | 365/185.18 |
| 2009/0268527 A1 | 10/2009 | Van Duuren et al. | |
| 2011/0205792 A1 | 8/2011 | Sarin et al. | |
| 2013/0141978 A1 * | 6/2013 | Hirose et al. | 365/185.18 |

OTHER PUBLICATIONS

International Search Report for International Application No. PCT/US12/67640 dated Feb. 15, 2013; 2 pages.
Written Opinion of the International Searching Authority for International Application No. PCT/US12/67640 dated Feb. 15, 2013; 6 pages.

* cited by examiner

*Primary Examiner* — Gene Auduong (57) ABSTRACT

Memory circuits and systems are provided. One memory circuit includes an active memory device, an inactive memory device, and a sense amplifier coupled between the active memory device and the inactive memory device. A reference current is coupled between the inactive memory device and the sense amplifier. The active memory device and the inactive memory device are the same type of memory device and the inactive memory device is a reference device with respect to the active memory device's current. A memory system includes a plurality of the above memory circuit coupled to one another. Methods for sensing current in a memory circuit are also provided. One method includes supplying power to a first memory device and comparing the amount of current in the first memory device and a reference current coupled to a second memory device that is the same type of memory device as the first memory device.

19 Claims, 9 Drawing Sheets

SYSTEMS AND METHODS FOR SENSING IN MEMORY DEVICES

RELATED APPLICATIONS

This application claims the benefit of U.S. Provisional Application No. 61/566,315 filed on Dec. 2, 2011, which is incorporated by reference.

BACKGROUND OF THE INVENTION

1. Field of the Invention

The present invention relates generally to memory devices and systems, and more particularly to, systems and method for sensing in memory devices.

2. Description of the Related Art

Contemporary volatile and non-volatile memory circuits have a large range of densities, are implemented using high density state of the art technologies for smallest die area, and require a fast read access time for the stored data. The read sensing circuits are also increasingly more affected by noise and process variations such that it is now critical for the sensing method to be robust as well as fast for the lowest silicon area.

Analog multi-stage sensing circuits have the disadvantage of having limited sensing speed capability without a significant increase in power consumption. The analog multi-stage sensing circuits are also area inefficient due to use of large "dummy" capacitors on the reference side and are not area efficient for scalable memory architectures.

Current configurations also use non-reversible reference active branches resulting in an increased area of silicon and employ an additional signal for sensing control having higher sensitivity to process variation. These configurations also have decreased noise and mismatch immunity for a given area and are not easily scalable for a desired range of memory densities.

BRIEF DESCRIPTION OF THE DRAWINGS

So that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with example embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The various embodiments described herein include memory circuits and memory systems. One memory circuit comprises an active memory device, an inactive memory device, and a sense amplifier coupled between the active memory device and the inactive memory device. The memory circuit further comprises a reference current is coupled between the inactive memory device and the sense amplifier. In various embodiments, the active memory device and the inactive memory device are the same type of memory device and the inactive memory device is a reference memory device with respect to current in the active memory device.

One memory system comprises a plurality of memory circuits coupled to one another. Here, each memory circuit comprises an active memory device, an inactive memory device, and a sense amplifier coupled between the active memory device and the inactive memory device. The memory circuit further comprises a reference current is coupled between the inactive memory device and the sense amplifier. In various embodiments, the active memory device and the inactive memory device are the same type of memory device and the inactive memory device is a reference memory device with respect to current in the active memory device.

Various other embodiments provide methods for sensing current in a memory circuit. One method comprises supplying power to a first memory device and comparing the amount of current in the first memory device and a reference current coupled to a second memory device that is the same type of memory device as the first memory device.

Figure 1:
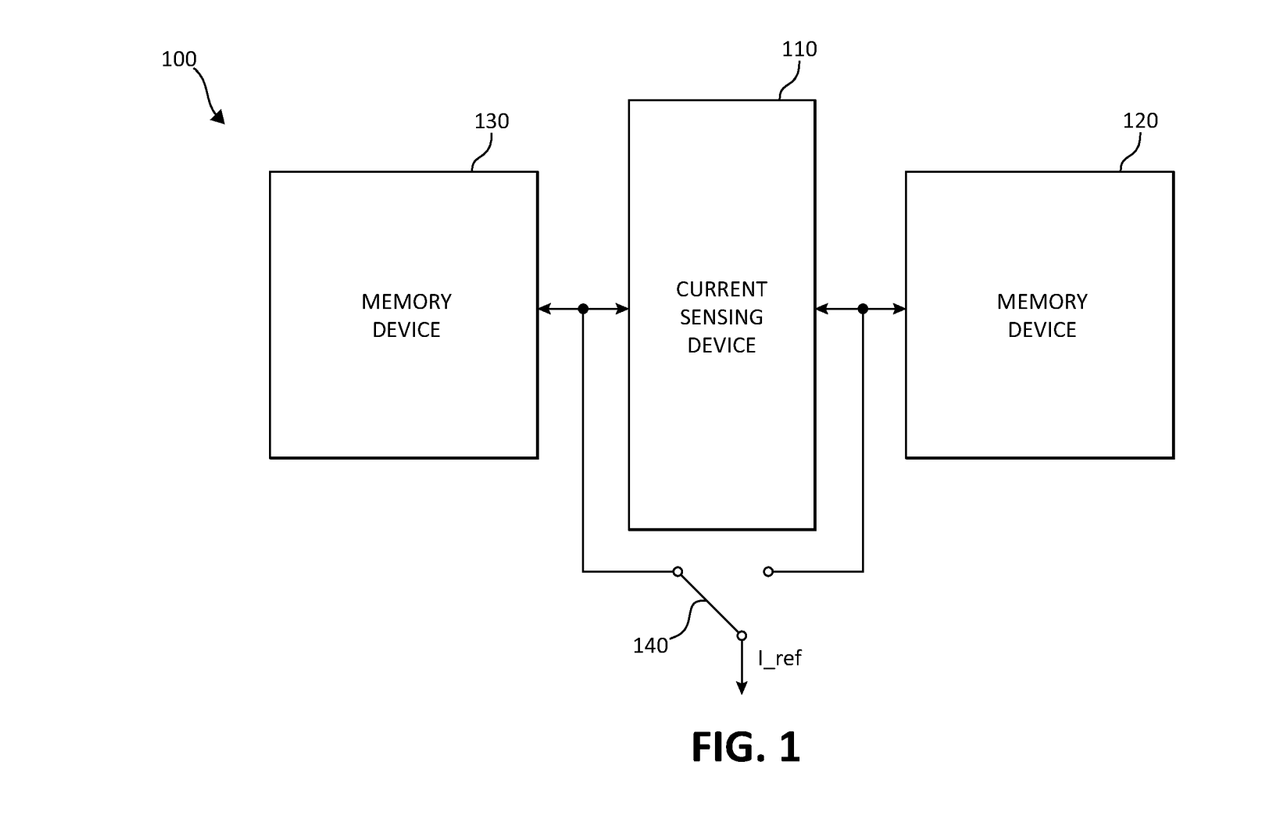
FIG. 1 is a block diagram of one embodiment of a memory circuit.

Turning now to the figures, FIG. 1 is a block diagram of one embodiment of a memory circuit 100 (e.g., a non-volatile memory, flash memory, etc.). At least in the illustrated embodiment, memory circuit 100 comprises a current sensing device 110 coupled between a memory device 120 and a memory device 130 and a reference current (I_ref) switchably coupled to memory device 120 and memory device 130 via a switch 140.

Current sensing device 110 may be any device, system, circuit, and/or the like capable of comparing the current in memory device 120 and I_ref. Examples of current sensing device 110 include, but are not limited to, a latch sensing circuit (see e.g., current sensing device 310 in FIG. 3 and current sensing device 510 in FIG. 5), a sense amplifier, a comparator, and/or the like current sensing devices.

Figure 2A:
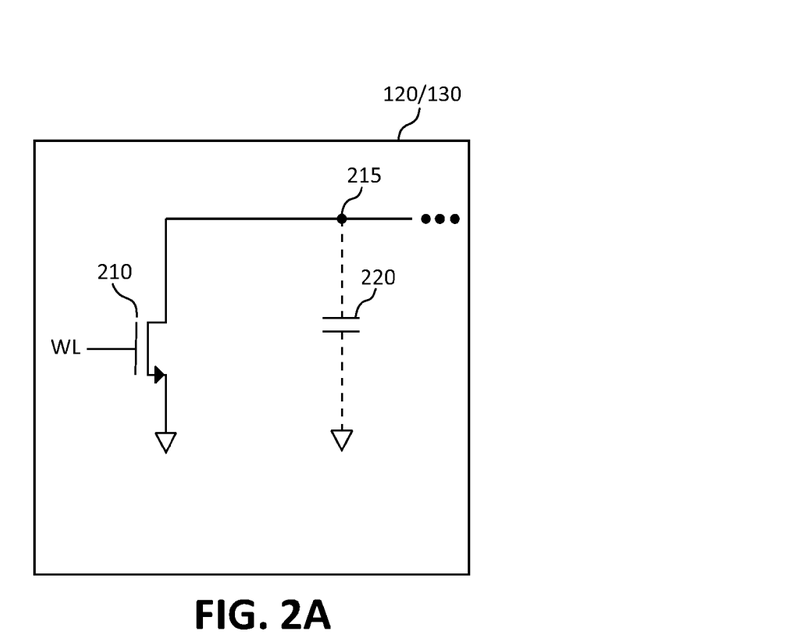
FIG. 2A is a schematic diagram of one embodiment of a memory device.

Memory device 120 may be any type of memory device known in the art or developed in the future. In one embodiment (see e.g., FIG. 2A), memory device 120 comprises a silicon-oxide-nitride-oxide-silicon (SONOS) transistor 210. In this embodiment, the drain of SONOS transistor 210 is coupled to a node 215. The gate of SONOS transistor 210 is coupled to a word line (WL) and the source of SONOS transistor 210 is coupled to ground. Node 215 is coupled to a capacitor 220 and to current sensing device 110.

Figure 2B:
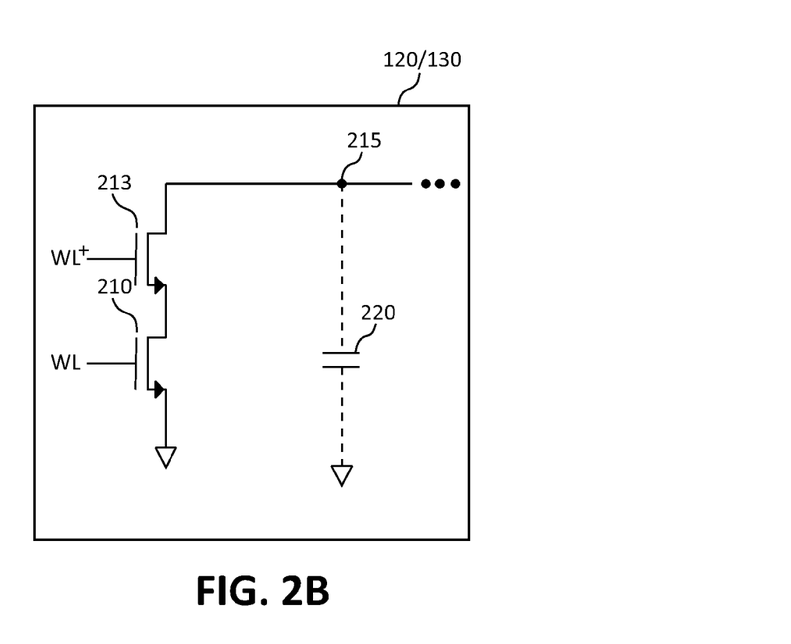
FIG. 2B is a schematic diagram of another embodiment of a memory device.

In other embodiment (see e.g., FIG. 2B), memory device 120 comprises a SONOS transistor 210 coupled to an n-channel metal oxide semiconductor field-effect transistor (nMOSFET) 213. In this embodiment, the drain of SONOS transistor 210 is coupled to the source of nMOSFET 213. The source of SONOS transistor 210 is coupled to ground and the gate of SONOS transistor 210 is coupled to a SONOS word line (WLS). The gate of nMOSFET 213 is coupled to a word line (WL+) and drain of nMOSFET 213 is coupled to a node 215. Node 215 is coupled to a capacitor 220 and to current sensing device 110.

Memory device 130 is the same type of memory device as memory device 120. For example, when memory device 120 comprises the memory circuit illustrated in FIG. 2A, memory device 130 also comprises the memory circuit illustrated in FIG. 2A. In another example, when memory device 120 comprises the memory circuit illustrated in FIG. 2B, memory device 130 also comprises the memory circuit illustrated in FIG. 2B. In other words, memory circuit 100 is symmetrical, with the exception of I_ref being coupled between memory device 130 and sensing device 110.

As illustrated in FIG. 1, I_ref is coupled between current sensing device 110 and memory device 130. With this configuration, memory device 130 forms a reference memory device for capacitance loading purposes with respect to memory device 120 because memory device 130 includes the same capacitance as memory device 120 since memory device 130 and memory device 120 are the same type of memory device (i.e., memory device 120 and memory device 130 include the same structure, topology, etc.).

In one embodiment, memory device 120 is supplied with power (or is selected/enabled) so that data can be read from memory device 120 such that memory device 120 is considered an "active" memory device, while memory device 130 is not supplied with power (or is de-selected) so that data cannot be read from memory device 130 such that memory device 130 is an "inactive" memory device. In other words, the inactive memory device (here, memory device 130) is coupled, via switch 140, to I_ref. Specifically, the position of switch 140 determines which of memory device 120 and memory device 130 is the active/inactive memory device. In other words, the active/inactive nature of memory device 120 and memory device 130 is reversible such that memory device 130 may be the active memory device, while memory device 120 is the inactive memory device. Furthermore, memory circuit 100 is also scalable, as discussed below with reference to FIGS. 4 and 6.

Figure 3:
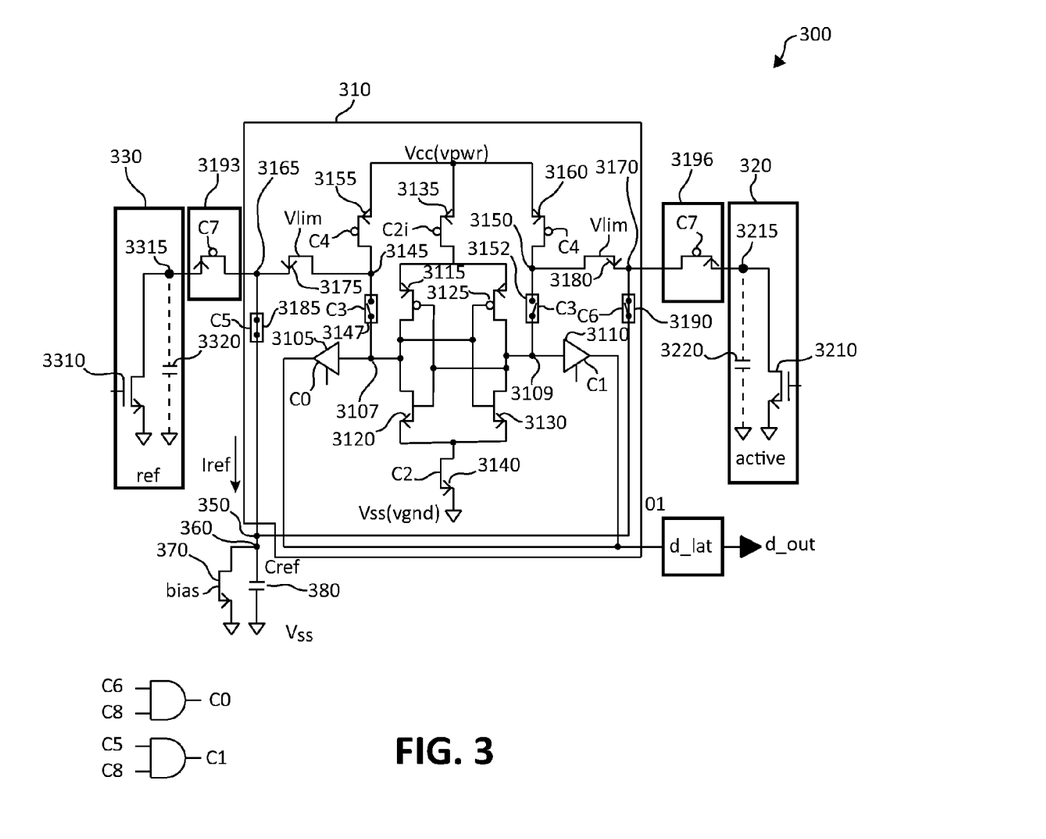
FIG. 3 is a block diagram of another embodiment of a memory circuit.

With reference now to FIG. 3, FIG. 3 is a block diagram of another embodiment of a memory circuit 300 (e.g., a non-volatile memory, flash memory, etc.). At least in the illustrated embodiment, memory circuit 300 comprises a current sensing device 310 coupled between a memory device 320 and a memory device 330 and a reference current (I_ref).

Current sensing device 310 comprises a latch-type configuration in which the tri-stated output may be multiplexed for a scalable memory capacity architecture (see FIG. 4, below). Specifically, current sensing device 310 comprises a tri-state buffer 3105 (controlled by a signal C0) and a tri-state buffer 3110 (controlled by a signal C1) that are coupled to output node 3107 and output node 3109, respectively, of current sensing device 310. The latch structure is implemented with the inverters arranged as a pair of cross-coupled inverters implemented with a p-channel metal oxide semiconductor field-effect transistor (pMOSFET) 3115, an nMOSFET 3120, a pMOSFET 3125, and an nMOSFET 3130. The latch is coupled to power (Vcc) using a pMOSFET 3135 and is controlled by an inverted signal C2i. The latch is also coupled and ground (Vss) using an nMOSFET 3140 controlled by a non-inverted signal C2.

Nodes 3145 and 3150 are coupled to the outputs by a switch 3147 (e.g., a complementary pair of metal oxide semiconductor field-effect transistors (MOSFETs)) and a switch 3152 (e.g., MOSFET), respectively, controlled by a signal C3. A pMOSFET 3155 controlled by a signal C3 is coupled between node 3145 and Vcc. Similarly, a pMOSFET 3160 controlled by signal C3 is coupled between node 3150 and Vcc. Here, nodes 3145 and 3150 can be forced to the Vcc voltage by pMOSFET 3155 and pMOSFET 3160, respectively, as controlled by signal C4 (i.e., the bitline equalization pulse).

Current sensing device 310 further comprises symmetrical inputs 3165 and 3170 that are coupled to nodes 3145 and 3150, respectively, with low threshold voltage nMOSFETs. A low threshold voltage nMOSFET 3175 is coupled between input 3165 and node 3145. Similarly, a second low threshold voltage nMOSFET 3180 is coupled between input 3170 and node 3150. nMOSFET 3175 and nMOSFET 3180 are biased by a voltage Vlim that represents a protection voltage for the memory cell since some memory cell architectures require that the voltage on the bitline be below a predetermined value.

Inputs 3165 and 3170 are coupled to a current reference sink-type source through switches 3185 and 3190, respectively. Switch 3185 is controlled by a signal C5 and switch 3190 is controlled by a signal C6. Signals C5 and C6 select the active and inactive (i.e., reference) sectors in memory circuit 300. For example, FIG. 3 illustrates that switch 3185 ON, while switch 3190 is OFF. When switch 3185 is ON, memory device 330 is inactive and represents a reference branch of memory circuit 300. When switch 3190 is OFF, memory device 320 is active and ready for a read operation.

Current sensing device 310 is coupled to a multiplexer (MUX) 3193 that is coupled to input 3165 and a MUX 3196 that is coupled to input 3170. MUX 3193 and MUX 3196 are both controlled by a signal C7 having a negative potential with respect to ground, which allows simultaneous connection of memory devices 320 and 330 and their respective bitlines to current sensing circuit 310.

Memory device 320, at least in the embodiment illustrated in FIG. 3, comprises a SONOS transistor 3210 including a source coupled to ground and a drain coupled to a node 3215, which is coupled to sensing device 310. Memory device 320 further comprises a bitline distributed capacitor 3220 coupled to ground and to node 3215.

Memory device 330 is the same type or substantially the same type of memory device as memory device 320. That is, memory device 330 comprises the same or substantially the same architecture or topology as memory device 320. Specifically, memory device 330 comprises a SONOS transistor 3310 including a source coupled to ground and a drain coupled to a node 3315, which is coupled to sensing device 310. Memory device 330 further comprises a bitline capacitor 3320 coupled to ground and to node 3315.

Memory circuit 300 also comprises an nMOSFET 370 for providing the reference current I_ref for the purpose of determining the amount of current in memory device 320. In the embodiment illustrated in FIG. 3, I_ref is coupled between memory device 330 and current sensing circuit 310. Furthermore, I_ref is coupled to a node 350 that is coupled to switches 3185 and 3190. Node 350 is further coupled to a node 360 that is coupled to nMOSFET 370 and a capacitor 380, both of which are coupled to ground.

The following explanation of the operation of memory circuit 300 may be beneficial in understanding the various embodiments of memory circuit 300. While the following explanation may be helpful in understanding memory circuit 300, the various embodiments of memory circuit 300 is not limited to the following operation of memory circuit 300.

As discussed above, memory device 320 is an "active" device and memory device 330 is an "inactive" device due to the selection of the signals WL. Also, switch 3185 is ON and switch 3190 is OFF to allow the coupling of I_ref. During the sensing process performed by current sensing circuit 310, the capacitance of the inactive bitline in memory device 330 is used as reference capacitance in conjunction with the additional capacitor 380 (Cref). Due to the use of the existing capacitance in memory device 330, the additional required reference capacitance is significantly reduced contributing to the overall circuit area reduction in memory circuit 300.

Furthermore, current sensing device 310 comprises tri-stated outputs selected by a combination of the sector select signals C5, C6, and the C8 signal, which is also used to latch the data read by current sensing device 310 and to provide the output data d_out. Here, memory device 330 is unselected because the gate of SONOS transistor 3310 is connected to ground, so memory device 330 is OFF, while memory device 320 is selected because SONOS transistor 3210 device is ON due to presence of a wordline select signal WL that is equal to or greater than the Vcc value (i.e., positive).

Notably, FIG. 3 illustrates that the capacitance of each bitline in memory devices 320 and 330 are equal or substantially equal. In addition, memory circuit is reversible such that memory device 330 may be the active memory device and memory device 320 may be the inactive memory device. Furthermore, memory circuit 300 is scalable as discussed with reference to FIG. 4.

Figure 4:
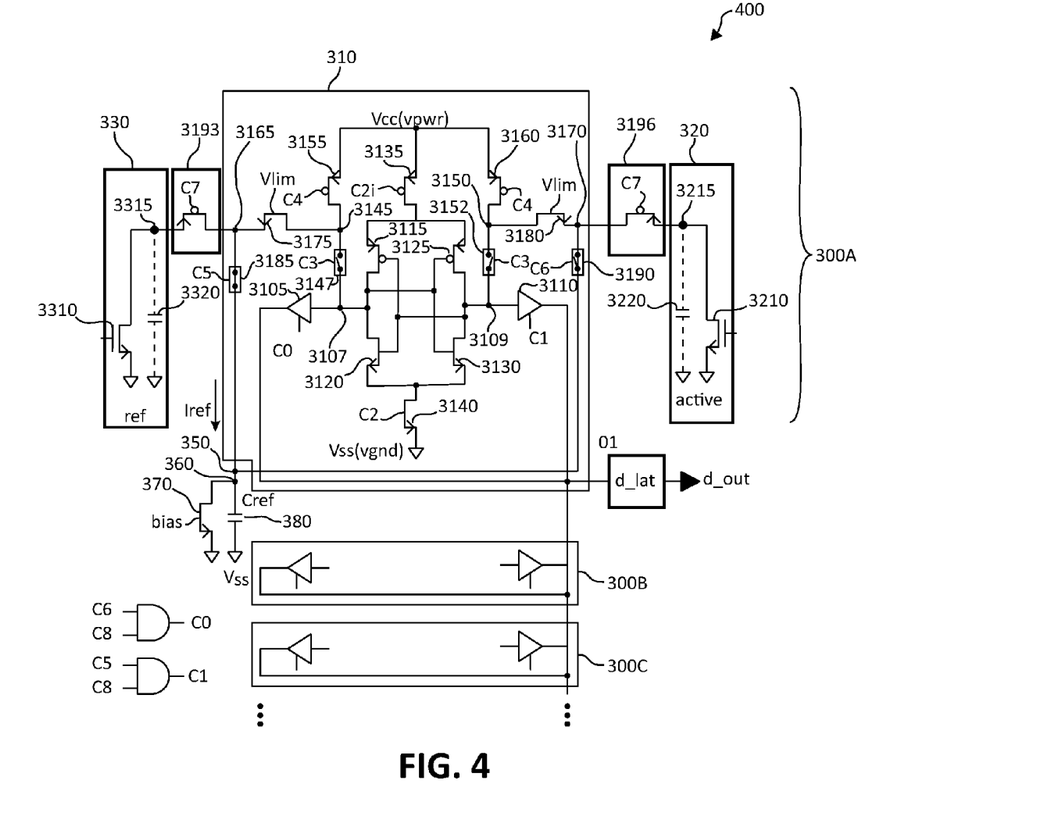
FIG. 4 is a block diagram of one embodiment of a memory system comprising a plurality of the memory circuits in FIG. 3.

FIG. 4 is a block diagram of one embodiment of a memory system 400 comprising a plurality of memory circuits 300. Memory circuits 300 are scalable because multiple current sensing circuits 310 can be multiplexed to a unique output by connecting their respective tri-stated outputs together without the need of additional logic.

In one embodiment, memory system 400 comprises an array of memory circuits 300 including a column and a plurality of rows. In another embodiment, memory system 400 comprises an array of memory circuits 300 including a plurality of columns and a row. In yet another embodiment, memory system 400 comprises an array of memory circuits 300 including a plurality of columns and a plurality of rows.

Figure 5:
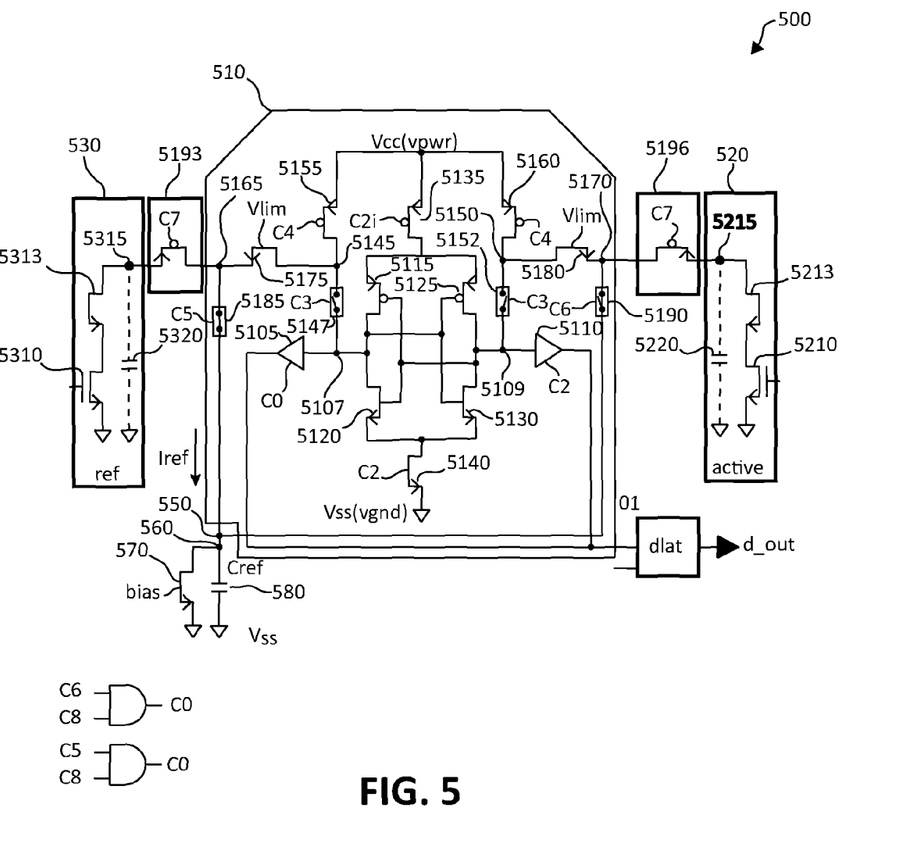
FIG. 5 is a block diagram of yet another embodiment of a memory circuit.

Referring now to FIG. 5, FIG. 5 is a block diagram of another embodiment of a memory circuit 500 (e.g., a non-volatile memory, flash memory, etc.). At least in the illustrated embodiment, memory circuit 500 comprises a current sensing device 510 coupled between a memory device 520 and a memory device 530 and a reference current (I_ref).

Current sensing device 510 comprises a latch-type configuration in which the tri-stated output may be multiplexed for a scalable memory capacity architecture (see FIG. 6, below). Specifically, current sensing device 510 comprises a tri-state buffer 5105 (controlled by a signal C0) and a tri-state buffer 5110 (controlled by a signal C1) that are coupled to output node 5107 and output node 5109, respectively, of current sensing device 510. The latch structure is implemented with the two inverters arranged as a pair of cross-coupled inverters implemented with a p-channel metal oxide semiconductor field-effect transistor (pMOSFET) 5115, an nMOSFET 5120, a pMOSFET 5125, and an nMOSFET 5130. The latch is coupled to power (Vcc) using a pMOSFET 5135 and is controlled by an inverted signal C2i. The latch is also coupled and ground (Vss) using an nMOSFET 5140 controlled by a non-inverted signal C2.

Nodes 5145 and 5150 are coupled to the outputs by a switch 5147 (e.g., a complementary pair of MOSFETs) and a switch 5152 (e.g., a MOSFET), respectively, controlled by a signal C3. A pMOSFET 5155 controlled by a signal C3 is coupled between node 5145 and Vcc. Similarly, a pMOSFET 5160 controlled by signal C3 is coupled between node 5150 and Vcc. Here, nodes 5145 and 5150 can be forced to the Vcc voltage by pMOSFET 5155 and pMOSFET 5160, respectively, as controlled by signal C4 (i.e., the bitline equalization pulse).

Current sensing device 510 further comprises symmetrical inputs 5165 and 5170 that are coupled to nodes 5145 and 5150, respectively, with low threshold voltage nMOSFETS. A low threshold voltage nMOSFET 5175 is coupled between input 5165 and node 5145. Similarly, a second low threshold voltage nMOSFET 5180 is coupled between input 5170 and node 5150. nMOSFET 5175 and nMOSFET 5180 are biased by a voltage Vlim that represents a protection voltage for the memory cell since some memory cell architectures require that the voltage on the bitline be below a predetermined value.

Inputs 5165 and 5170 are coupled to a current reference sink-type source through switches 5185 and 5190, respectively. Switch 5185 is controlled by a signal C5 and switch 5190 is controlled by a signal C6. Signals C5 and C6 select the active and inactive (i.e., reference) sectors in memory circuit 500. For example, FIG. 5 illustrates that switch 5185 ON, while switch 5190 is OFF. When switch 5185 is ON, memory device 530 is inactive and represents a reference branch of memory circuit 500. When switch 5190 is OFF, memory device 520 is active and ready for a read operation.

Current sensing device 510 is connected to a MUX 5193 that is coupled to input 5165 and a MUX 5196 that is coupled to input 5170. MUX 5193 and MUX 5196 are both controlled by a signal C7 having a negative potential with respect to ground, which allows simultaneous connection of memory devices 520 and 530 and their respective bitlines to current sensing circuit 510.

Memory device 520, at least in the embodiment illustrated in FIG. 5, comprises a SONOS transistor 5210 including a drain coupled to ground and a source coupled to the drain of an nMOSFET 5213. The source of nMOSFET 5213 is coupled to a node 5215 that is coupled to sensing device 510. Memory device 520 further comprises a bitline capacitor 5220 coupled to ground and to node 5215.

Memory device 530 is the same type or substantially the same type of memory device as memory device 520. That is, memory device 530 comprises the same or substantially the same architecture or topology as memory device 520. Specifically, memory device 530 comprises a SONOS transistor 5310 including a drain coupled to ground and a source coupled to the drain of an nMOSFET 5313. The source of nMOSFET 5313 is coupled to a node 5315 that is coupled to sensing device 510. Memory device 530 further comprises a bitline distributed capacitor 5320 coupled to ground and to node 5315.

Memory circuit 500 also comprises an nMOSFET 570 for providing the reference current I_ref for the purpose of determining the amount of current in memory device 520. In the embodiment illustrated in FIG. 5, I_ref is coupled between memory device 530 and current sensing circuit 510. Furthermore, I_ref is coupled to a node 550 that is coupled to switches 5185 and 5190. Node 550 is further coupled to a node 560 that is coupled to nMOSFET 570 and a capacitor 580, both of which are coupled to ground.

The following explanation of the operation of memory circuit 500 may be beneficial in understanding the various embodiments of memory circuit 500. While the following explanation may be helpful in understanding memory circuit 500, the various embodiments of memory circuit 500 is not limited to the following operation of memory circuit 500.

As discussed above, memory device 520 is an "active" device and memory device 530 is an "inactive" device due to the selection of signals WL. Also, switch 5185 is ON and switch 5190 is OFF to allow the coupling of I_ref to the inactive memory device. During the sensing process performed by current sensing circuit 510, the capacitance of the inactive bitline in memory device 530 is used as reference capacitance in conjunction with the capacitor 580 (C_ref). Due to the use of the existing capacitance in memory device 530, the additional required reference capacitance is significantly reduced contributing to the overall circuit area reduction in memory circuit 500.

Furthermore, current sensing device 510 comprises tri-stated outputs selected by a combination of the sector select signals C6, C6, and the C8 signal, which is also used to latch the data read by current sensing device 510 and to provide the output data d_out. Here, memory device 530 is unselected because the gate of SONOS transistor 5310 is connected to ground, so memory device 530 is OFF, while memory device 520 is selected because SONOS transistor 5210 device is ON due to presence of a wordline select signal WL that is equal to or greater than the Vcc value (i.e., positive).

Notably, FIG. 5 illustrates that the capacitance of each bitline in memory devices 520 and 530 are equal or substantially equal. In addition, memory circuit is reversible such that memory device 530 may be the active memory device and memory device 520 may be the inactive memory device. Furthermore, memory circuit 500 is scalable as illustrated in FIG. 6.

Figure 6:
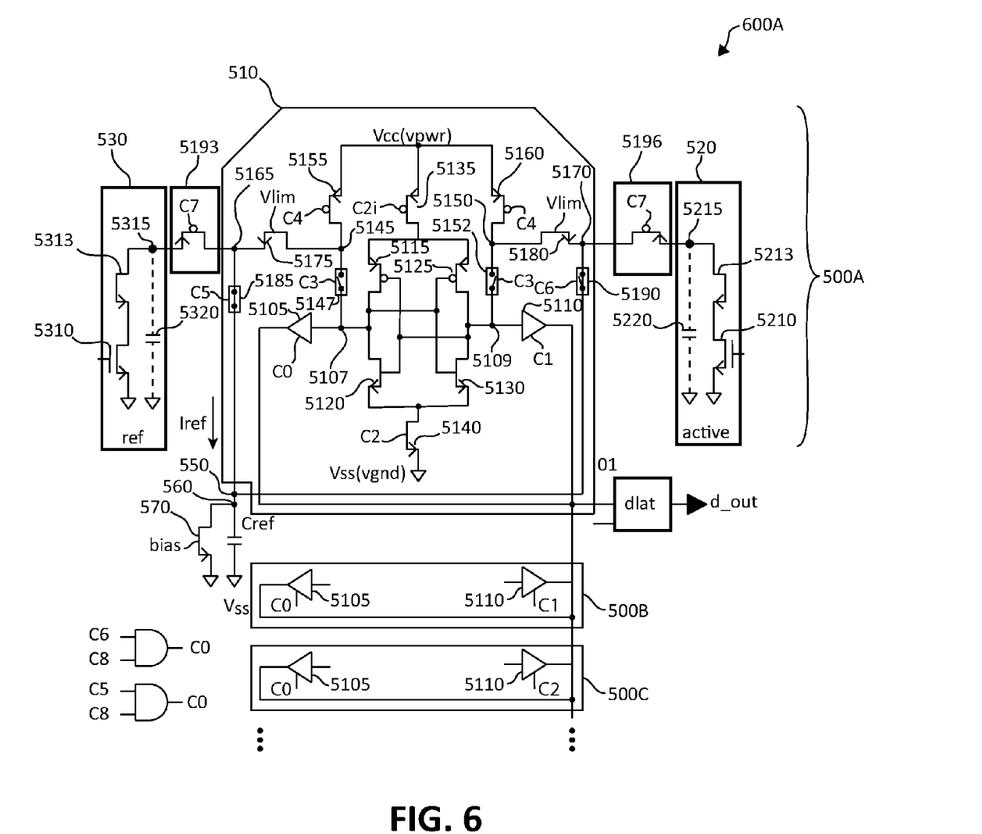
FIG. 6 is a block diagram of another embodiment of a memory system comprising a plurality of the memory circuits in FIG. 5.

FIG. 6 is a block diagram of one embodiment of a memory system 600 comprising a plurality of memory circuits 500. Memory circuits 500 are scalable because multiple current sensing circuits 510 can be multiplexed to a unique output by connecting their respective tri-stated outputs together without the need of additional logic.

In one embodiment, memory system 600 comprises an array of memory circuits 500 including a column and a plurality of rows. In another embodiment, memory system 600 comprises an array of memory circuits 500 including a plurality of columns and a row. In yet another embodiment, memory system 600 comprises an array of memory circuits 500 including a plurality of columns and a plurality of rows.

Figure 7:
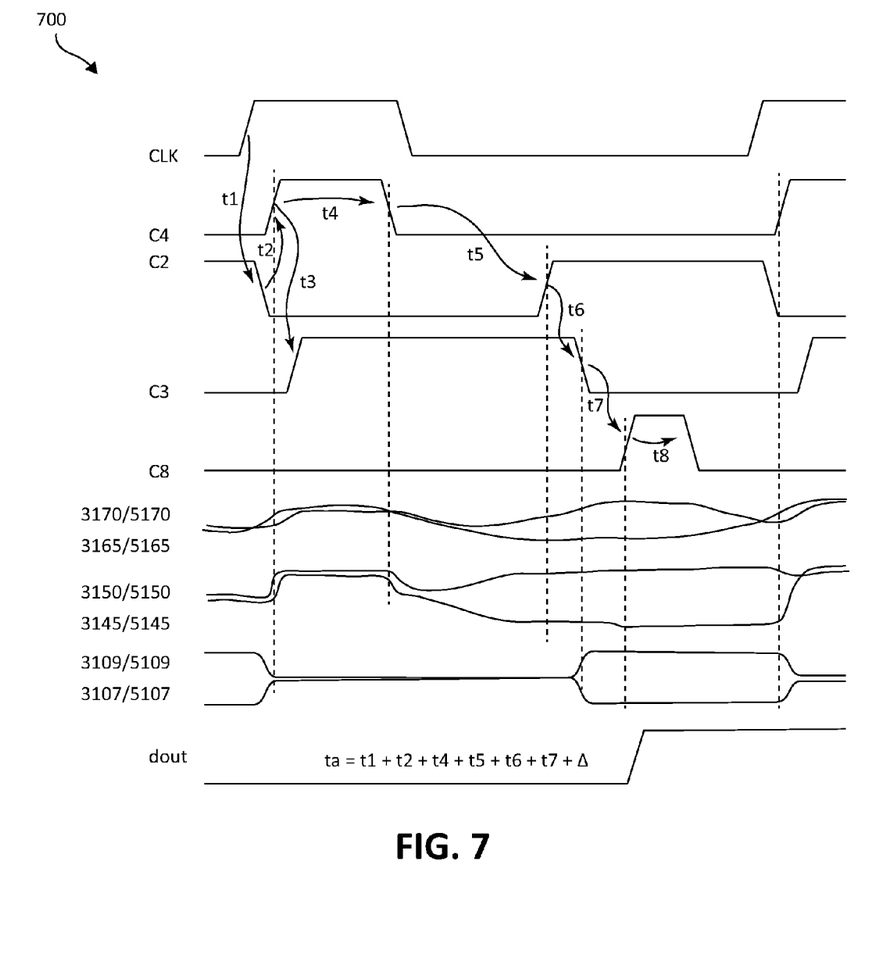
FIG. 7 is a waveform diagram of the various embodiments described herein.

FIG. 7 is a waveform diagram 700 of the various embodiments described herein. As shown in waveform diagram 700, the sensing cycle for a memory read operation is controlled by a clock signal CLK. On the rising edge of CLK, a signal C2 is switched at first time (t1) to a low, 0 logic state. This state disconnects the latch structure from the power supply (Vcc) and ground (Vss), which makes the inverters in the latch structure float for a short period of time until C4 and then C3 are asserted. At a second time (t2), the C4 equalization pulse is asserted. When C3 becomes a high, 1 logic state, node 3145/5145 and node 3150/5150 are pulled to Vcc. Node 3165/5165 and node 3170/5170 will have about the same potential (equalization), which is close to the Vlim protection voltage. Node 3107/5107 and node 3109/5109 (i.e., the latch outputs) have both about the same potential, being both connected to node 3145/5145 and node 3150/5150 by switch 3147/5147 (controlled by C3) and switch 3152/5152 (controlled by C3), respectively. The current reference sink is connected to node 3165/5165 and switch 3185/5185 is controlled by C5. After the C4 pulse ends, the total reference capacitance in parallel with Cref (i.e., the capacitance of memory device 330/530) that was previously charged during the equalization, starts to discharge. Since memory device 320/520 is, for example, a non-volatile programmed cell, there is no current flowing through memory device 320/520 and, as a result, node 3170/5170 remains at a higher potential than node 3165/5165. When C2 is asserted a high, 1 logic state, the differential voltage between node 3165/5165 and node 3170/5170 reaches a value capable of switching the latch to the correct state. At this moment, the latch is enabled by connecting the Vcc to pMOSFET 3155/5155 and pMOSFET 3160/5160, and by connecting the Vss or ground to nMOSFET 3120/5120 and nMOSFET 3130/5130.

Notably, the differential voltage between node 3145/5145 and node 3150/5150 increases faster than the differential voltage between node 3165/5165 and node 3170/5170, which are directly connected to the bitlines of memory device 330/530 and memory device 320/520, respectively, and dynamically isolates the bitlines from sensing circuit 310/510. The isolation is the result of an isolation effect provided by the low threshold nMOSFET 3175/5175 and nMOSFET 3180/5180, which are biased by the Vlim voltage that acts as a common gate amplifier.

After switch 3147/5147 and switch 3152/5152, which are controlled by C3, are turned OFF, the latch state becomes settled and the data stored in the latch is ready to be sent to the output. This is done during the C8 latching signal, which stores the data in the output data latch (d_lat). For the case presented in this example, the data out is high, 1 logic state. The total access time from the rising edge of the CLK signal to the dout signal available at the output represent the sum ta=t1+t2+t4+t5+t6+t7+Δ, where Δ is the propagation time of the output latch d_lat.

Figure 8:
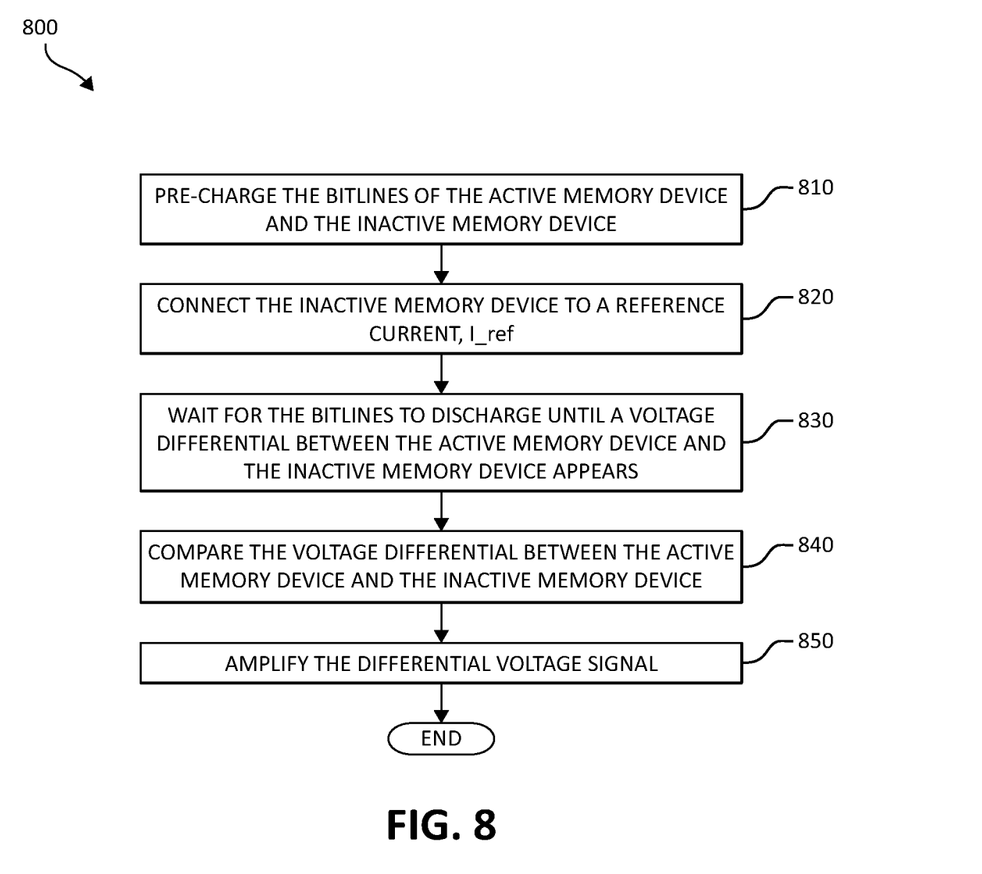
FIG. 8 is a flow diagram of one embodiment of a method for sensing current in a memory circuit.

FIG. 8 is a flow diagram of one embodiment of a method 800 for sensing current in a memory circuit. Examples of a memory circuit include, but are not limited to memory circuit 100, memory circuit 300, or memory circuit 400.

At least in the illustrated embodiment, method 800 begins by pre-charging the bitlines of the active memory device and the inactive memory device (block 810). Method 800 continues by connecting the inactive memory device to the reference current, I_ref (block 820).

After the inactive memory device is connected to I_ref, method 800 includes waiting for the bitlines of the active memory device and the inactive memory device to discharge until a voltage differential between the active memory device and the inactive memory device to appear (block 830). The voltage differential between the active memory device and the inactive memory device are compared (block 840) and the differential signal is amplified (block 850).

Figure 9:
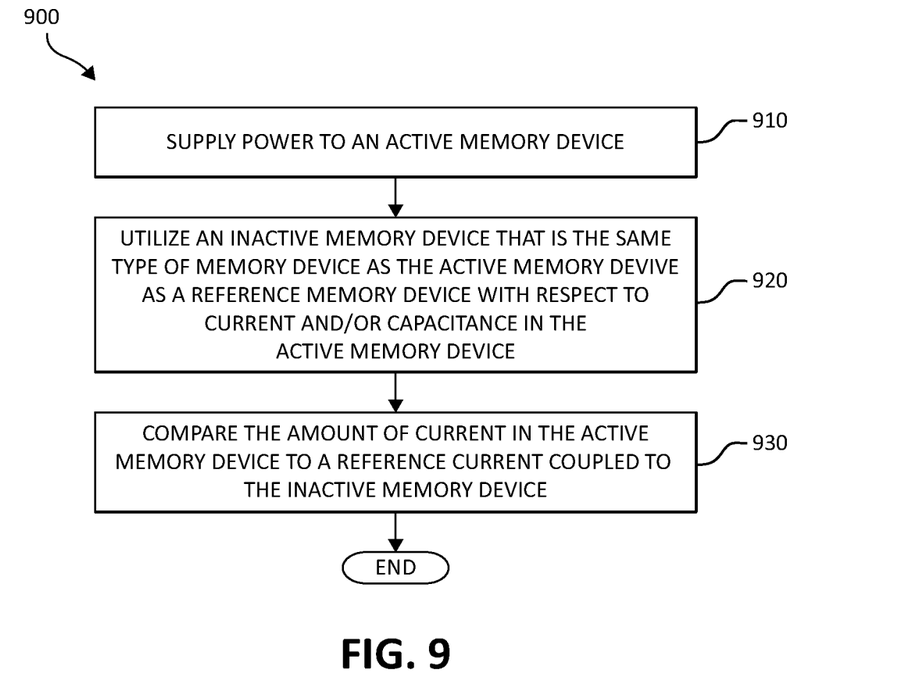
FIG. 9 is a flow diagram of another embodiment of a method for sensing current in a memory circuit.

FIG. 9 is a flow diagram of one embodiment of a method 900 for sensing current in a memory circuit. Examples of a memory circuit include, but are not limited to memory circuit 100, memory circuit 300, or memory circuit 400.

At least in the illustrated embodiment, method 900 begins by supplying power to an active memory device (e.g., memory device 120, memory device 320, or memory device 420) (block 910). An inactive memory device (e.g., memory device 130, memory device 330, or memory device 430) that is the same or substantially the same type of memory device as the active memory device is utilized as a reference memory device with respect to current and/or capacitance in the active memory device (block 920). The amount of current in the active memory device is compared to a reference current (e.g., I_ref) coupled to the inactive memory device (block 930).

What is claimed is:

1. A memory circuit, comprising:
a first memory device and a second memory device;
a sense amplifier coupled between the first memory device and the second memory device;
a reference current; and
a switch configured to couple the reference current to only the second memory device when the switch is in a first state of operation and couple the reference current to only the first memory device when the switch is in a second state of operation,
wherein when the switch is in the first state of operation the second memory device is an unpowered, inactive memory device and the first memory device is a powered, active memory device from which data can be read, and when the switch is in the second state of operation the first memory device is the inactive memory device and the second memory device is the active memory device.

2. The memory circuit of claim 1, wherein the sense amplifier comprises a latch sensing circuit comprising a first input coupled to the active memory device and a second input coupled to the inactive memory device and the reference current.

3. The memory circuit of claim 2, wherein the active memory device and the inactive memory device each comprise one of a silicon-oxide-nitride-oxide-silicon (SONOS) transistor, a non-volatile memory device, and a flash memory device.

4. The memory circuit of claim 2, wherein the active memory device and the inactive memory device each comprise a silicon-oxide-nitride-oxide-silicon (SONOS) transistor and an n-channel metal oxide semiconductor field effect transistor (nMOSFET) coupled to the SONOS transistor.

5. The memory circuit of claim 4, wherein the active memory device and the inactive memory device each further comprise:
a bit line;
a first word line;
a second word line; and
a source line.

6. The memory circuit of claim 5, wherein the active memory device and the inactive memory device are reversible such that the active memory device is capable of being the inactive memory device and the inactive memory device is capable of being the active memory device, wherein:
the nMOSFET comprises a first drain coupled to the bit line, a first gate coupled to the first word line, and a first source, and
the SONOS transistor comprises a second drain coupled to the first source, a second gate coupled to the second word line, and a second source coupled to the source line.

7. The memory circuit of claim 1, wherein the sense amplifier is configured to compare a first amount of current in the active memory device and the reference current.

8. The memory circuit of claim 1, further comprising:
a first multiplexer (MUX) coupled between the active memory device and the sense amplifier; and
a second MUX coupled between the inactive memory device and the reference current.

9. A memory system, comprising:
a plurality of memory circuits coupled to one another, wherein each memory circuit comprises:
a first memory device and a second memory device,
a sense amplifier coupled between the first memory device and the second memory device,
a reference current; and
a switch configured to couple the reference current to only the second memory device when the switch is in a first state of operation and couple the reference current only the first memory device when the switch is in a second state of operation,
wherein when the switch is in the first state of operation the second memory device is an unpowered, inactive memory device and the first memory device is a powered, active memory device from which data can be read, and when the switch is in the second state of operation the first memory device is the inactive memory device and the second memory device is the active memory device.

10. The memory system of claim 9, wherein the plurality of memory circuits form an array of memory circuits.

11. The memory system of claim 9, wherein each active memory device and each inactive memory device comprises a silicon-oxide-nitride-oxide-silicon (SONOS) transistor.

12. The memory system of claim 11, wherein each active memory device and each inactive memory device further comprises an n-channel metal oxide semiconductor field effect transistor (nMOSFET) coupled to the SONOS transistor.

13. The memory system of claim 12, wherein each active memory device and each inactive memory device further comprises:
a bit line;
a first word line;
a second word line; and
a source line, wherein:
the nMOSFET comprises a first drain coupled to the bit line, a first gate coupled to the first word line, and a first source, and
the SONOS transistor comprises a second drain coupled to the first source, a second gate coupled to the second word line, and a second source coupled to the source line.

14. The memory system of claim 9, wherein each memory circuit is reversible such that the active memory device is capable of being the inactive memory device and the inactive memory device is capable of being the active memory device.

15. The memory system of claim 9, wherein each latch sensing circuit is configured to compare an amount of current in the active memory device and the reference current to which each respective latch sensing circuit is coupled.

16. The memory system of claim 9, wherein each memory circuit further comprises:

a first multiplexer (MUX) coupled between the active memory device and the latch sensing circuit; and a second MUX coupled between the inactive memory device and the reference current.

17. A method for sensing current in a memory circuit, comprising:
   supplying power to a only a first of first and second memory devices, wherein the first and second memory devices are a same type of memory device;
   coupling a reference current through a switch to only the second memory device;
   comparing a first amount of current in the first memory device and the reference current coupled to only the second of the first and second memory devices to read data from the first memory device;
   supplying power to only the second of the first and second memory devices;
   coupling the reference current through the switch to only the first memory device; and
   comparing a second amount of current in the second memory device and the reference current when the reference current is coupled to only the first of the first and second memory devices to read data from the second memory device.

18. The method of claim 17, further comprising utilizing the second memory device as a reference memory device with respect to current in the first memory device.

19. The method of claim 17, wherein:
   supplying the power to the first memory device comprises supplying the power to an active memory device at a first time;
   the first memory device is the active memory device; and
   the second memory device is an inactive memory device.

* * * * *